(12) United States Patent
Bleeker et al.

(10) Patent No.: US 7,259,829 B2
(45) Date of Patent: Aug. 21, 2007

(54) LITHOGRAPHIC APPARATUS AND DEVICE MANUFACTURING METHOD

(75) Inventors: Arno J. Bleeker, Westerhoven (NL);
Wim T. Tel, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 241 days.

(21) Appl. No.: 10/898,667

(22) Filed: Jul. 26, 2004

(65) Prior Publication Data

US 2006/0017903 A1 Jan. 26, 2006

(51) Int. Cl.
*G03B 27/32* (2006.01)
*G03B 27/54* (2006.01)

(52) U.S. Cl. .......................................... 355/67; 355/77
(58) Field of Classification Search ................... 355/53, 355/67, 77; 430/5
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,312,134 B1 * | 11/2001 | Jain et al. | 359/855 |
| 6,687,041 B1 | 2/2004 | Sandstrom | |
| 6,707,534 B2 * | 3/2004 | Bjorklund et al. | 355/53 |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,813,062 B2 * | 11/2004 | Sandstrom | 359/292 |
| 6,833,908 B2 * | 12/2004 | Markle | 355/77 |
| 6,844,920 B2 * | 1/2005 | Luellau | 355/67 |
| 7,009,753 B2 * | 3/2006 | Sandstrom | 359/291 |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| | | |
|---|---|---|
| WO | WO98/33096 | 7/1998 |
| WO | WO98/38597 | 9/1998 |

* cited by examiner

*Primary Examiner*—Rodney Fuller
(74) *Attorney, Agent, or Firm*—Sterne, Kessler, Goldstein & Fox P.L.L.C.

(57) ABSTRACT

A lithographic apparatus is provided that uses an array of individually controllable elements to pattern the beam of radiation. The critical dimension uniformity of a substrate patterned using the apparatus is improved by adjusting the pattern data provided to the array of individually controllable elements to compensate for process variation.

22 Claims, 3 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

The substrate may be subjected to a variety of processes before the exposure process. For example, the substrate will generally be treated with resist before exposure. Also, prior to exposure, the substrate may be subjected to cleaning, etching, ion implantation (e.g., doping), metalization, oxidation, chemo-mechanical polishing, priming, resist coating, soft bake processes, and/or measurement processes. The substrate may also be subjected to a variety of post-exposure processes, for example, post-exposure bake (PEB), development, hard bake, etching, ion implantation (e.g., doping), metalization, oxidation, chemo-mechanical polishing, cleaning, and/or measurement processes. Furthermore, typically several layers are required. Therefore, the entire processing procedure or variant thereof, is repeated for each layer.

The pre-exposure and post-exposure processes are performed by stations or modules designed for their respective purposes. The substrate is subjected to these processing modules, as well as the lithographic exposure apparatus, in a pre-defined sequence. In order for devices formed on a substrate to function correctly, it is necessary for the features of those devices formed on the substrate to be within a given tolerance of a specified size. It is therefore standard to specify key attributes, which are collectively referred to as a critical dimension (CD) of the exposed pattern, in order to characterize the features and the profile of the pattern and establish a bench mark level of quality and uniformity. The CD metric may include, for example, a gap between features, X and/or Y diameter of holes and/or posts, ellipticity of holes and/or posts, an area of a feature, a feature side wall angle, a width at the top of a feature, a width at the middle of a feature, a width at the bottom a feature, line edge roughness, or the like.

The size of a feature formed on a substrate is, in general, determined by the areas of resist on the substrate that receive a threshold dose of radiation in the exposure process. This threshold dose is affected by the type of resist used, the processing conditions before exposure, and the processing conditions after the exposure. Therefore, variations in the pre-exposure and post-exposure conditions affect the size of features, and hence, the critical dimension uniformity (CDU), potentially compromising the quality of the exposed pattern. If the CDU is not sufficient, a substrate may be rejected, reducing the yield.

Therefore, what is needed is lithographic apparatus and method that can be used to expose patterns on a substrate with improved CDU.

SUMMARY OF THE INVENTION

An embodiment of the present invention provides a lithographic apparatus comprising an illumination system for supplying a beam of radiation, an array of individually controllable elements serving to impart the beam with a pattern in its cross-section, a substrate table for supporting a substrate, a projection system for projecting the patterned beam onto a target portion of the substrate, and a controller for setting a pattern on the array of individually controllable elements based on intended pattern data that corresponds to a pattern to be exposed on the substrate and processing conditions data that corresponds to at least one of the processing conditions of the substrate.

In one example, it is possible to compensate for variations that will be produced in a pattern formed on the substrate caused by the variations in pre-exposure and/or post-exposure processes. Therefore, a CDU for a given substrate can be improved.

In one example, the use of the lithographic apparatus allows a CDU to be improved not only across different regions of the substrate, but also from substrate to substrate.

In one example, the controller uses the processing conditions data to adjust, as required, a size of the pattern features that are generated in a pattern set on the array of individually controllable elements. For example, if the processing conditions data indicates that without correction the features formed on the substrate will be slightly oversized once processing of the substrate is complete, the controller adjusts the pattern set on the array of individually controllable elements to be slightly smaller than it would be were no correction made. Consequently, the pattern that is actually generated on the substrate is closer to the intended size, improving the CDU.

In one example, each part of the patterned beam, corresponding to one of the individually controllable elements, can be set to one of at least three radiation intensity levels (e.g., can provide grey-scale control of the patterned beam of radiation). The controller adjusts the intensity level of the pattern in response to the processing conditions data. For example, if the processing conditions data indicates that, without correction, a feature formed on the substrate would be oversized, the intensity level of the corresponding part of the patterned beam is reduced by adjusting the settings of the array individually controllable elements. Consequently, a smaller area of the feature reaches the requisite dosage threshold and the size of the feature generated on the substrate is reduced, compared to its size were no correction made.

In one example, a variety of data relating to the processing conditions may be taken into account, which can include: (1) the resist applied to the substrate (e.g., different types of resist will have different consequent responses to other pre-exposure and post-exposure conditions); (2) the process conditions during the application of the resist to the substrate (e.g., the thickness of the resist layer, the thermal profile during the application process that may include a soft bake process, etc.); (3) the corresponding process conditions during the application of any other layer applied to the substrate (e.g., a BARC (Bottom Anti Reflection Coating) that may be applied before the resist to reduce the generation of standing waves in the resist to improve imaging conditions and CDU performance); (4) the time elapsed between the resist being applied to the substrate and an exposure, which, due to the relatively long time taken to expose a substrate using a lithographic apparatus using an array of individually controllable elements, may have a significant impact on the threshold dosage for the resist; this may change significantly from the portion first exposed on a substrate to the last portion exposed on a substrate; (5) the elapsed time between the resist being applied to the substrate and the commencement of the post-exposure processing steps (e.g., this will affect the response of the exposed resist when it is developed); (6) the time elapsed or the expected time elapsed between any other two processes; (7) the process conditions of the post-exposure bake, including the thermal profile; again this will affect the response of the exposed resist when it is developed; (8) the process conditions of chilling the substrate after the post-exposure bake, again including the thermal profile which will also affect the response of the exposed substrate when it is developed; (9) the process conditions during the developing of the substrate; (10) the conditions during transport of the substrate between the various processing apparatus; and/or (11) the expected process conditions in subsequent etching, ion implantation, metalisation, oxidation, chemo-mechanical polishing and cleaning processes.

In one example, at least some of the processing conditions data is specific to each area of the substrate. This allows the exposure conditions for each exposure of a portion of the substrate to be optimized for that portion. Consequently, the data from the transport operations may include data on any changes of orientation of the substrate during the transfer, such that it is possible to determine the complete processing history for each portion of each substrate.

In one example, the processing conditions data may be recorded as each substrate is processed, for example by measuring the conditions in the relevant apparatus as the substrate is processed. For example, as each substrate is coated with resist, the precise processing conditions may be recorded and taken into account during the exposure process.

In one example, some processing apparatus may provide processing conditions that are relatively stable over time. In this case, the controller may store a set of data associated with that apparatus rather than receiving measured data. For example, an exposure unit may receive substrates from two or more resist coating units. Provided the process conditions in each of the resist coating units are stable over time, it will then merely be necessary for the controller in the exposure unit to receive data associated with each substrate that identifies which resist coating unit processed that substrate. The pattern can then be optimized based on the processing conditions data for the relevant resist coating unit. It may also receive data corresponding to the orientation of the substrate in that unit if the process conditions vary across the substrate within the resist coating unit. This arrangement is especially useful for compensating for the affects of the post-exposure processes because the actual post-exposure processing conditions cannot be known at the time of the exposure.

In one example, the data associated with each such processing apparatus can be updated. The data may be updated by monitoring the actual process conditions as one or more substrate is processed.

In one example, the necessary correction to the data associated with each processing apparatus may be deduced from subsequent inspection of the features generated on substrates that have been processed with that apparatus. Continually updating the data associated with each apparatus ensures that if the processing conditions are stable over relatively short timescales, sufficiently accurate estimates of conditions in post-exposure processes, for example, can be provided even if the conditions are not stable over relatively long timescales.

In one example, the amendments to the intended pattern data that are required before the pattern can be set on the array of individually controllable elements may be determined before any of the exposures on the substrate (or, at least those required to generate a particular layer of the device to be formed) commence.

In one example, the necessary amendments may be determined during the process of exposing the pattern for a given layer. For example, the amendments for one exposure on a given substrate may be determined while another exposure is proceeding. The latter arrangement allows for the amendments to the pattern data to take account of the actual measured processing conditions and, for example, the actual time between the resist being applied to the substrate and the exposure taking place. Because the necessary data processing can be conducted in advance of the exposure step, rather than on-the-fly, there is no limitation on the data processing time required and therefore a simpler controller may be used. However, such a system can be limited because may be necessary to know in advance which of the processing apparatus will be used for a particular substrate. Therefore, if the processing of a substrate needs to be rescheduled, namely it requires processing in different pre-exposure and post-exposure apparatus then it is necessary to re-calculate the modifications. On-the-fly calculation avoids this problem.

In one example, the controller may include a memory for storing transformation data, for the different processing conditions, the modifications that must be made to the pattern that is intended to be produced on a substrate before the pattern is set on the array of individually controllable elements.

In one example, the memory may store the pattern modifications necessary for complete sets of processing conditions (e.g., taking into account all of the processing conditions and their interactions).

In one example, in a second configuration, the memory may contain data relating to pattern modifications for each component in the system. In this case, it is possible to determine the complete pattern modification required by taking together the individual modifications associated with the processing conditions in each element.

The first example is simpler to arrange and may be more accurate because it takes account of the interactions of processing conditions in different parts of the system. However, the second example requires less data to be stored and is more feasible if a large number of process parameters are to be taken account of.

In one example, consider a system in which 10 of the process parameters are to be taken account of and each may have 10 different values. The total number of possible combinations for which, complete pattern modification data would need to be stored under the first arrangement is $10^{10}$, namely 10,000,000,000. In contrast, if the second arrangement were used, 100 sets of pattern modification data, namely 10 for each of the 10 process parameters monitored, would need to be stored and which could then be combined in a plurality of different ways.

Although the first example is theoretically more accurate, the second example may provide sufficiently accurate control provided that the deviations caused by variations of each parameter are small and the variations of the parameters do not interact with each other. The amount of data to be stored in the first configuration may be reduced by excluding some alternative processing options. For example, the system may be confined such that if a substrate is initially processed by a first apparatus, subsequent processing operations may only be performed by a limited set of other apparatus (and excluding other apparatus).

In one example, the pattern modification data stored in the memory can be updated based on a comparison of pattern features that are intended to be formed on the substrate and an inspection of actual pattern features that are subsequently generated on the substrate using the existing pattern modification data.

In one example, during the exposure of a substrate relatively small variations of the pattern modification data in the memory are used for exposures at different locations on the substrate. By subsequently inspecting the actual pattern features subsequently formed at each of these locations and comparing the actual features generated with the intended features, it is possible to determine if the pattern modification data in the memory is optimal and to change it to one of the variations tested if such a variation of the pattern modification data proves to be better. If the variations in the CD, caused by these small variations in the pattern modification data, are small enough this process may be used continuously during production exposure of the substrates, constantly refining the pattern modification data.

In one example, larger test variations in the pattern modification data may be used during exposure of test substrates to set up the apparatus and generate an initial set of pattern modification data.

In general, it will be appreciated that the pattern modification data in the memory will need to be initially generated by exposing patterns on a plurality of substrates, under different processing conditions and inspecting the patterns subsequently produced.

In one example, the lithographic apparatus includes a detector for inspecting features generated on the substrate to provide automatic feedback to the controller to enable the pattern modification data to be updated.

Another embodiment of the present invention provides a device manufacturing method comprising the steps of providing a substrate, providing a beam of radiation using an illumination system, using an array of individually controllable elements to impart the beam with a pattern in its cross-section, and projecting the patterned beam of radiation onto a target portion of the substrate. The pattern set on the array of individually controllable elements is based on intended pattern data that corresponds to a pattern to be exposed on the substrate and processing conditions data that corresponds to at least one of the processing conditions of the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENTS

Overview and Terminology

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
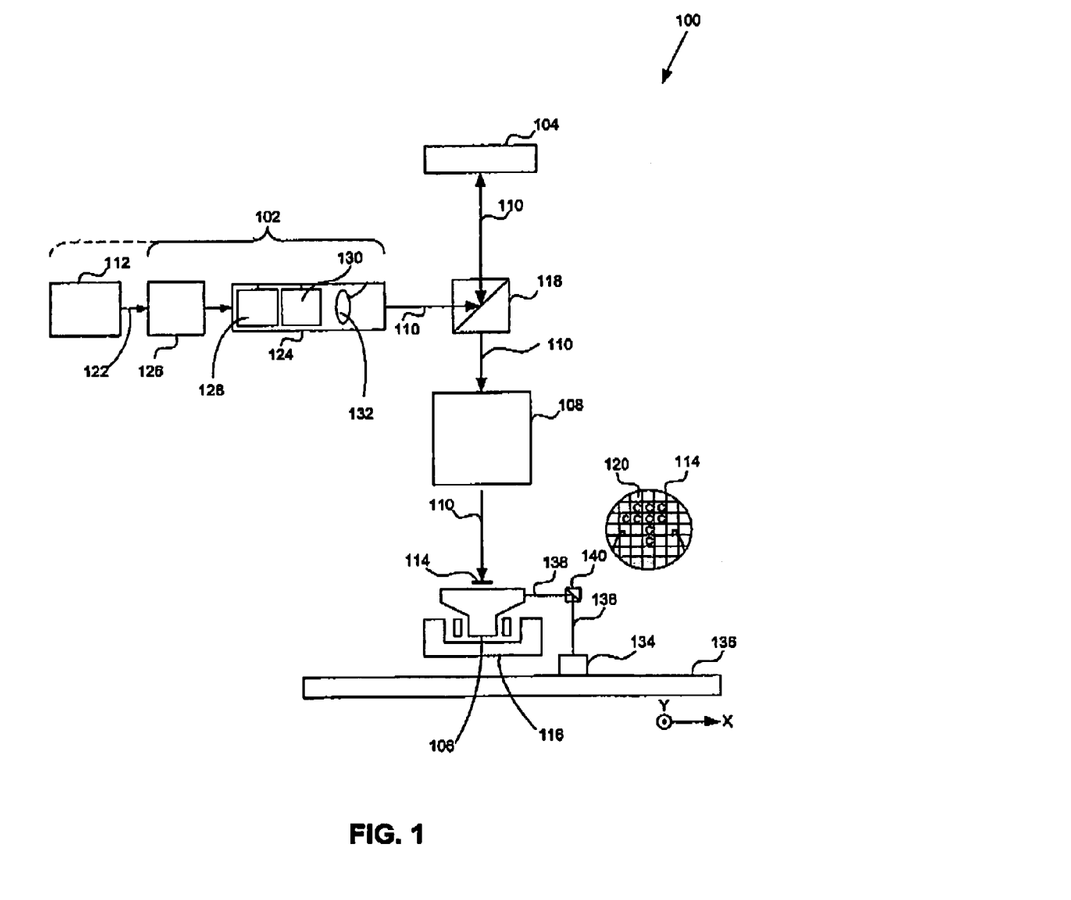
FIG. 1 depicts a lithographic apparatus, according to one embodiment of the invention

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

In the embodiment shown in FIG. 1, array of individually controllable elements 104 is a programmable mirror array. Programmable mirror array 104, comprises a matrix arrangement of tiny mirrors, each of which can be individually tilted about an axis. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern.

In one example, the series of states includes: (a) a black state in which radiation reflected by the mirror makes a minimum, or even a zero contribution to the intensity distribution of its corresponding pixel; (b) a whitest state in which the reflected radiation makes a maximum contribution; and (c) a plurality of states in between in which the reflected radiation makes intermediate contributions. The states are divided into a normal set, used for normal beam patterning/printing, and a compensation set, used for compensating for the effects of defective elements. The normal set comprises the black state and a first group of the intermediate states. This first group will be described as grey states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states are being described as white states, it will be appreciated that this is simply to facilitate the distinction between the normal and compensatory exposure steps. The entire plurality of states could alternatively be described as a sequence of grey states, between black and white, selectable to enable grey-scale printing.

Figure 2:
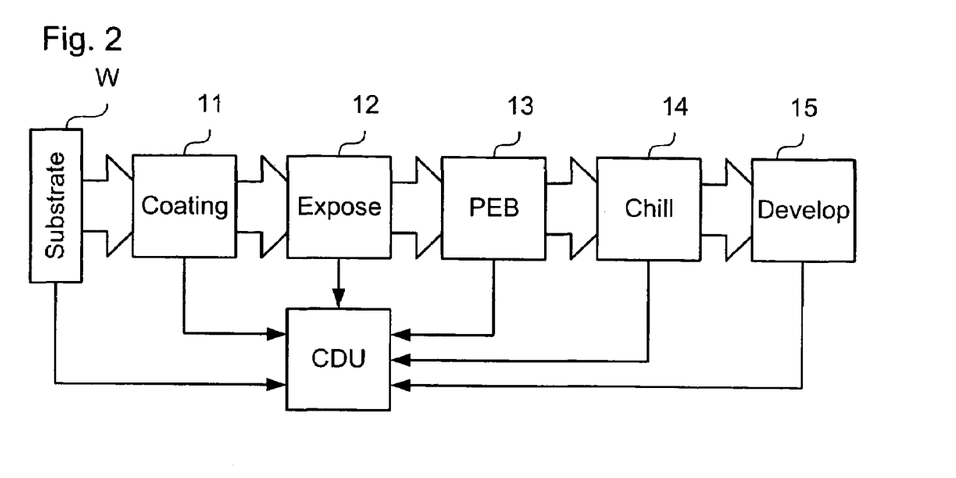
FIG. 2 depicts a schematic representation of processing units used to generate a pattern on a substrate, according to one embodiment of the present invention.

FIG. 2 depicts a schematic representation of processing units used to generate a pattern on a substrate, according to one embodiment of the present invention. In processing unit 11, the substrate is coated with a resist. In processing unit 12, the resist is exposed with a patterned beam of radiation. In processing unit 13, the substrate and its exposed resist is baked in a post-exposure bake (PEB) device. In processing unit 14, the substrate is cooled. In processing unit 15, the substrate is developed.

It is to be appreciated that additional processes may also be performed. In one example, the above and additional processes may take place in a dedicated apparatus. In another example, two or more of the processes may be carried out within the same apparatus. For example, the post-exposure bake step and the chill step may be performed in a combined apparatus. In addition, the substrate must be transported between the different processing apparatus and/or within each apparatus if, for example, an apparatus is performing process steps in different parts of the apparatus.

A response of the resist to the exposure will be affected by the processing conditions at each stage. The effect of this is that the threshold dosage for the exposure radiation will change. Consequently, without compensation, a feature generated on the substrate may not be precisely the feature that was intended. For example, if the threshold radiation dosage is reduced, a larger portion of the resist will receive the threshold radiation dose and a patterned feature generated on the substrate will correspondingly be larger than was intended.

In a production facility there may be a plurality of apparatus for performing a process. There may be, for example, two or more resist coating apparatus for providing resist-coated substrates to each exposure apparatus or there may be a plurality of resist coating apparatus, any one of which may provide resist-coated substrates to any of a plurality of exposure apparatus. The processing conditions are likely to vary from apparatus to like apparatus. Additionally, the processing condition within a specific processing apparatus may vary across a substrate. For example, in a post-exposure bake apparatus the thermal profile (e.g., a variation of temperature over time) for one part of a substrate may be different to that of another part of the same substrate. The processing conditions may also vary over time within each apparatus.

Because each substrate or each part of the substrate may be subject to different processing conditions, the response of the resist to the exposure radiation for each substrate (or part substrate) will be different. If an identical radiation pattern is exposed on two different parts of one substrate or on two different substrates, the two patterns actually generated will be slightly different. For example, the size of the pattern features on one, measured by the CD of the pattern, may be larger than the intended pattern features, while those on the other may be slightly smaller. Typically, one finds that consequently, the CD varies from substrate to substrate and across each substrate.

Figure 3:
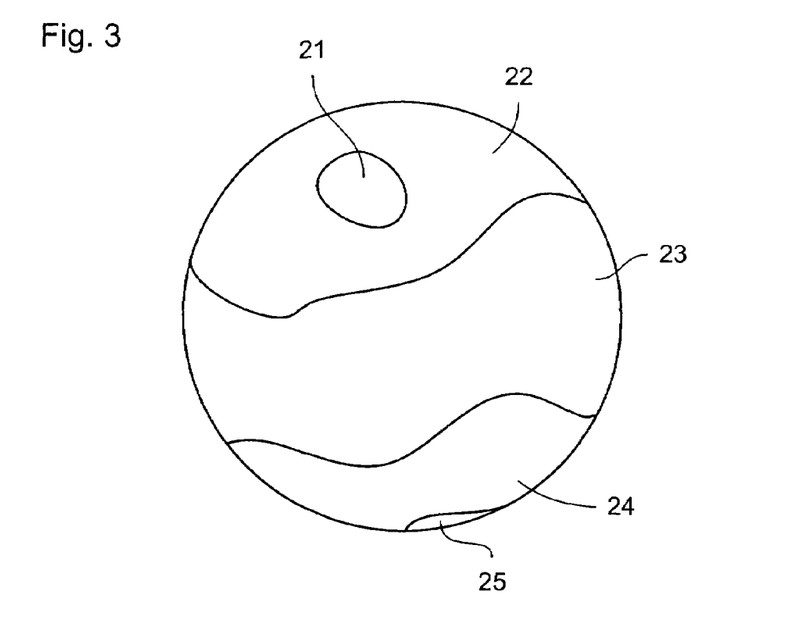
FIG. 3 depicts a substrate showing critical dimension contours, according to one embodiment of the present invention.

FIG. 3 depicts a substrate showing critical dimension contours, according to one embodiment of the present invention. There are a plurality of areas, each characterized by a different CD. In one example, a CD in a first area 21 may be 100 nm, a CD in a second area 22 may be 105 nm, a CD in a third area 23 may be 110 nm, a CD in a fourth area 24 may be 105 nm, and a CD in a fifth area 25 may be 100 nm. In this example, the performance of devices formed in the different areas would be vary. If the variation is too large, the devices formed in some of the areas of the substrate would be rejected. Accordingly, in order to ensure that the yield of the manufacturing process is adequate, it is necessary to ensure that the CD variation, both across each substrate and between substrates, is minimized. This is referred to as the CD uniformity (CDU).

Referring again to FIG. 2, each part of the process will have an impact on the CDU. For example, the process conditions in the resist coating unit 11 may vary from coating apparatus to coating apparatus, may vary over time within one coating apparatus, and may vary for different parts of a given substrate that is coated. In addition, variations across the substrate, for example caused by the previous generation of other pattern layers on the substrate, will also contribute to the CDU. Therefore, is necessary to minimize the contributions from each step to the reduction in the CDU and/or to compensate for each of these contributions.

Figure 4:
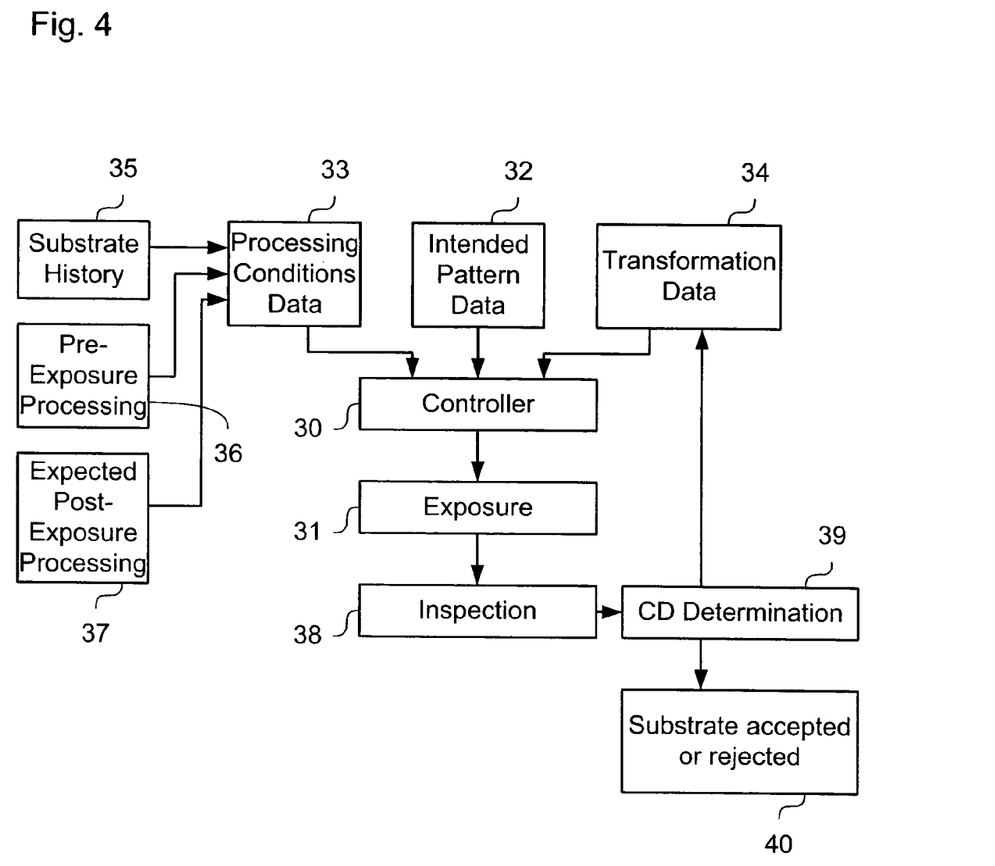
FIG. 4 depicts a process, according to one embodiment of the present invention.

FIG. 4 depicts an exemplary processing system, according to the present invention. A controller 30 controls an exposure apparatus 31 during an exposure step. In order to set a desired pattern on an array of individually controllable elements, controller 30 accesses intended pattern data 32, which represents the pattern that is intended to be generated on a substrate during each exposure. Controller 30 also accesses processing conditions data 33, which represents processing conditions that the substrate has been and/or is expected to be subject to and that may affect a CDU. In the exemplary system shown in FIG. 4, controller 30 also accesses transformation data 34 that may, for example, be stored in a memory within controller 30 and that corresponds to changes that must be applied to intended pattern data 32 to compensate for the processing conditions represented by processing conditions data 33. The modified pattern data is used to set the array of individually controllable elements for the exposure. Consequently, a resultant pattern formed on the substrate more closely resembles the intended pattern then would be the case if no corrections were made.

The modification to the pattern may be effected at any stage in the control of the array of individually controllable elements. In one example, the basic pattern data itself may be modified. In another example, the modification may be made to the data after the pattern data has been transformed to data corresponding to each pixel (i.e., bit map data). In a further example, the modifications may be applied once the data has been converted into control signals for setting the patterns on the array of individually controllable elements.

It will be appreciated, that a combination of these examples may be used. For example, compensation of some effects on the CDU may be most easily effected on the basic pattern data. However, compensation of other effects on the CDU may be more easily effected on the control signals for the array of individually controllable elements. Accordingly, separate adjustments may be used for each.

In one example, processing conditions data 33 may include data representing a number of different processing conditions. However, it may also only relate to a single processing condition if, for example, a single processing condition has a far greater effect on the CDU than any of the other processing conditions. In general, processing conditions data 33 that is used in the adjustment of the patterns set on the array of individually controllable elements will be those processing conditions that have the greatest affect on the CDU and/or can be measured sufficiently to be compensated for effectively. The processing conditions data 33 may include substrate history data 35, which relates to previous processing history of the substrate, pre-exposure processing data 36, which relates to processing steps taking place before the exposure, and expected post-exposure processing data 37, which relates to processing steps that are scheduled to take place after the exposure step.

Example processing conditions data 33 can be, but is not limited to, any of: (1) CD history of at least one pattern layer previously generated on the substrate; (2) a type of resist applied to the substrate; (3) process conditions during the application of the resist on the substrate; (4) time between the resist being applied to the substrate and the exposure of the substrate; (5) expected time between the resist being applied to the substrate and the processing of the substrate after the exposure; (6) process conditions during the baking of the substrate that occurs after the exposure; (7) process conditions during the subsequent chilling of the substrate; and/or (8) process conditions during the developing of the substrate.

In addition, the processing conditions data may include details of the conditions during transport of the substrate between the different apparatus used in the processes and/or during any storage of the substrate between processes. It is to be appreciated that other processing conditions that may affect the CDU and may therefore be included in the processing conditions data 33, as would be apparent to one of ordinary skill in the art.

The processing conditions may vary across each substrate. For example, during the post-exposure bake, the thermal profile (e.g., a variation of the temperature over time) may be different for different parts of the substrate. In one example, the processing conditions data is recorded and available to controller 30 for each portion of the substrate. Consequently, the pattern modifications for each part of the substrate may be appropriate for the processing conditions that it has been subjected to, allowing an improvement in the CDU across the substrate. In this example, the processing conditions data may also include data relating to the orientation of a substrate within each apparatus and/or data relating to any changes in orientation of the substrate during transport operations such that the processing conditions at different locations within an apparatus can be correspondingly recorded for each portion of the substrate.

In one example, processing conditions data 33 may include data that has been measured for the substrate that is to be exposed. For example, processing conditions for process steps taking place before the exposure of the substrate may be measured. However, the processing conditions data need not correspond to measurements taken for each substrate. For example, the processing conditions data may be data that is associated with one or more of the apparatus (e.g., process conditions that are known exist in a given apparatus). This is desirable if the processing conditions within an apparatus do not vary significantly over time. Accordingly for a given processing step to be performed in a given apparatus, the processing conditions for a substrate or part of a substrate are known in advance. If the processing conditions within an apparatus change gradually over time, then the actual processing conditions within the apparatus can be monitored and the data recorded for that apparatus updated as required. This is desirable for taking account of process conditions in the processes that take place after the exposure because it is not possible to modify the exposure conditions based on the processing conditions in process steps that have not yet occurred. In this case, it is necessary to base any adjustments on the expected processing conditions in the subsequent processing steps, namely processing conditions data 33 associated with apparatus that the substrate is scheduled to be processed in. If a plurality of apparatus are available for the subsequent processing steps, then a determination can be made in which of the apparatus the substrate will be processed in so that data specific to that apparatus can be used in determining the necessary pattern adjustment.

In one example, processing conditions data 33 is available in advance of the exposure of the substrate. Then, pattern adjustment can be determined prior to the exposure. Consequently, the calculations can be performed without significant regard for the speed of calculation. Alternatively, the modifications to the pattern data may be determined shortly before the exposure or as the exposures on the substrate are performed. This can require a more complex controller because any necessary calculations will need to be performed more quickly. However, it can then take account of processing conditions data 33 that is recorded immediately prior to the exposure and/or recorded as the exposure takes place (e.g., a time between the resist being applied to the substrate and the exposure taking place). Additionally, if the adjustments are determined on-the-fly or shortly before the exposure, it is not necessary to know in advance the schedule for each substrate. Therefore, if the schedule changes, the pattern adjustments do not need to be recalculated. For example, in a production facility, there may be two or more coating apparatus. If the pattern adjustments are to be determined prior to the exposure, it is desirable to known in which apparatus the substrate is scheduled to be coated with resist.

Once the processing conditions data for each substrate or each part of a substrate is determined, the pattern data is modified. The object of the modification is to change the pattern that is set on the array of individually controllable elements, such that the pattern that is actually generated on the substrate, taking account of the distortions that will take place because of the varying processing conditions, is the actual intended pattern or sufficiently close that the yield of the devices formed on the substrate is acceptable (e.g., that an adequate number of the devices formed on the substrate function sufficiently well). This may be achieved by changing the size of a pattern feature in the pattern set on the array of individually controllable elements. For example, if the processing conditions for part of a substrate are such that the actual pattern formed on the substrate would be smaller than expected for a given pattern set on the array of individually controllable elements, the pattern that is actually set on the array of individually controllable elements is larger than would otherwise be set (e.g., using just the intended patterned data), such that once the pattern has been generated on the substrate it corresponds to the intended size.

In one example, when using apparatus with an array of individually controllable elements that can set the intensity of different parts of the patterned beam of radiation to be any one of a plurality of levels (e.g., grey scaling), the pattern can be adjusted by setting the pattern intensity on the array of individually controllable elements to be different than that which would be set using the intended pattern data alone. For example, if the processing conditions data is such that the size of a patterned feature that would actually be generated on the substrate would be smaller than intended (e.g., using just the intended pattern data), the intensity of the pattern feature set on the array of individually controllable elements is increased. Accordingly, a larger area on the substrate receives the threshold radiation dose and the size of the pattern feature correspondingly increases, compensating for the size reduction caused by the processing conditions. It will be appreciated that a combination of these pattern modifications may be used, namely changing the size of the pattern set on the array of individually controllable elements and the intensity.

Referring back to FIG. 4, in this embodiment after a substrate has been exposed and processed, it may be inspected using an inspection unit 38. A CD Determination unit 39 can determine the CD of the pattern actually generated on the substrate and/or the variation of the CD over the substrate.

In one example, if a critical dimensional uniformity (CDU) is within the required tolerances, the substrate is accepted. Otherwise, if the CDU is not within the required tolerances, it may be rejected using a processing unit 40.

In either case, the determined CD distribution for the substrate may be used to update transformation data 34 that is used to modify the pattern data. For example, if the pattern modification did not result in the expected compensation of the pattern feature size, transformation data 34 is changed.

In one example, before the apparatus is used for full production, a plurality of test substrates with varying patterns, varying processing conditions, and varying pattern modification data may be exposed and inspected in order to generate initial transformation data 34. For example, for a given set of processing conditions data, different transformations (e.g., represented by transformation data) may be used for different exposures and/or different parts of an exposure in order to determine which of the pattern adjustments is most effective for compensating for a given set of processing conditions.

In one example, during production a similar arrangement may be used. For example, at different portions on a substrate or during different exposures, small variations of transformation data 34 may be used to adjust the pattern. Provided the CD variations cause by these variations in the transformation data are sufficiently small, this will not detrimentally affect the overall CDU. However, the variations may be sufficient to determine which of the variations of transformation data 34 is most effective and the most effective one subsequently stored as new transformation data 34. In this way transformation data 34 may be incrementally amended and optimized.

In various example, transformation data 34 may be arranged in a number of fashions. For example, transformation data 34 may represent modifications to be made to the pattern data for each of the possible values for each processing condition. In this case, the complete modification of the pattern is generated by successively applying transformation data 34 for each of the processing conditions that is being taken account of. Alternatively, transformation data 34 may correspond to the pattern modification that is required for a complete set of processing conditions. In other words, transformation data 34 may include a modification data set for each of the possible combinations of each of the processing conditions being taken account of in each of its possible values. A combination of the two arrangements may also be used.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a beam of radiation;
   an array of individually controllable elements that pattern the beam;
   a projection system that projects the patterned beam onto a target portion of a substrate; and
   a controller that controls a pattern formed using the array of individually controllable elements using (a) intended pattern data, which corresponds to a pattern to be exposed on the substrate, and (b) processing conditions data, which corresponds to at least one processing condition of the substrate, wherein the controller controls a size of at least one feature of the pattern relative to a size of the pattern specified by the intended pattern data based on the processing condition data.

2. The lithographic apparatus of claim 1, wherein:
   an intensity of the patterned beam is set to any one of at least three intensity levels; and
   the controller controls, based on the processing conditions data, which of the at least three intensity levels at least one feature of the pattern in the patterned beam is set to relative to an intensity level specified for the at least one feature in the intended pattern data.

3. The lithographic apparatus of claim 1, wherein the processing conditions data comprises data corresponding to at least one of:
   a type of resist applied to the substrate;
   process conditions of applying the resist to the substrate;
   a time period correlated to at least two processing operations;
   process conditions of baking the substrate after exposure;
   process conditions of chilling the substrate after baking the substrate;

process conditions of developing the substrate;

transport of the substrate between the lithographic apparatus and apparatus for performing other processes on the substrate; and expected process conditions in subsequent etching, ion implantation, metalization, oxidation, chemomechanical polishing, and/or cleaning processes.

4. The lithographic apparatus of claim 1, wherein:

the processing conditions data corresponding to at least one process condition is different at two or more areas on the substrate; and the controller selects and uses the processing conditions data corresponding to the target portion on the substrate when setting the pattern on the array of individually controllable elements to expose said target portion.

5. The lithographic apparatus of claim 1, wherein at least a part of the processing conditions data is generated from data previously recorded and corresponding to process conditions during processing of a previously processed substrate in at least one of an apparatus that has performed a process on the substrate and an apparatus that is scheduled to perform a process on the substrate.

6. The lithographic apparatus of claim 1, wherein the pattern to be set on the array of individually controllable elements for each part of the exposure of a pattern layer on the substrate is determined before the exposure of the pattern layer on the substrate commences.

7. The lithographic apparatus of claim 1, wherein the pattern to be set by the array of individually controllable elements for at least one part of the exposure of a pattern layer on the substrate is determined during the exposure of that pattern layer on the substrate.

8. The lithographic apparatus of claim 1, wherein the controller comprises:

a memory that stores transformation data corresponding to a difference between pattern data specified in the intended pattern data and the pattern to be set by the array of individually controllable elements for given processing conditions data.

9. The lithographic apparatus of claim 8, wherein the transformation data is updated based on a comparison of at least one feature intended to be generated on the substrate and an inspection of the corresponding at least one feature subsequently generated on the substrate.

10. The lithographic apparatus of claim 9, wherein the controller uses one or more modified versions of the transformation data for given processing conditions data at a plurality of locations on the substrate during the exposure of a pattern layer on the substrate.

11. The lithographic apparatus of claim 9, further comprising:

a detector that inspects at least one feature of the pattern generated on the substrate, wherein the controller compares the at least one inspected pattern feature with the corresponding at least one intended pattern feature and updates the transformation data.

12. A device manufacturing methods, comprising:

forming a pattern with an array of individually controllable elements using (1) intended pattern data, which corresponds to a pattern to be exposed on the substrate, and (2) processing conditions data, which corresponds to at least one processing condition of the substrate, wherein the processing conditions data controls a size of at least one feature of the pattern relative to a size of the pattern specified by the intended pattern;

patterning a beam of radiation using the formed patterned on the array of individually controllable elements; and projecting the patterned beam onto a target portion of a substrate.

13. A lithographic apparatus, comprising:

an illumination system configured to supply a beam of radiation;

an array of individually controllable elements configured to pattern the beam of radiation,;

a projection system that projects the patterned beam onto a target portion of a substrate; and a controller configured to set an intensity of the patterned beam to any one of at least three intensity levels and to control a pattern formed using the array of individually controllable elements using (a) intended pattern data, which corresponds to a pattern to be exposed on the substrate, and (b) processing conditions data, which corresponds to at least one processing condition of the substrate, wherein the controller is configured to also control which of the at least three intensity levels at least one feature of the pattern in the patterned beam is set to relative to an intensity level specified for the at least one feature in the intended pattern data based on the processing conditions data.

14. The lithographic apparatus of claim 13, wherein the processing conditions data comprises data corresponding to at least one of:

a type of resist applied to the substrate;

process conditions of applying the resist to the substrate;

a time period correlated to at least two processing operations;

process conditions of baking the substrate after exposure;

process conditions of chilling the substrate after baking the substrate;

process conditions of developing the substrate;

transport of the substrate between the lithographic apparatus and apparatus for performing other processes on the substrate; and expected process conditions in subsequent etching, ion implantation, metalization, oxidation, chemomechanical polishing, and/or cleaning processes.

15. The lithographic apparatus of claim 13, wherein:

the processing conditions data corresponding to at least one process condition is different at two or more areas on the substrate; and the controller selects and uses the processing conditions data corresponding to the target portion on the substrate when setting the pattern on the array of individually controllable elements to expose said target portion.

16. The lithographic apparatus of claim 13, wherein at least a part of the processing conditions data is generated from data previously recorded and corresponding to process conditions during processing of a previously processed substrate in at least one of an apparatus that has performed a process on the substrate and an apparatus that is scheduled to perform a process on the substrate.

17. The lithographic apparatus of claim 13, wherein the pattern to be set on the array of individually controllable elements for each part of the exposure of a pattern layer on the substrate is determined one or before or during the exposure of the pattern layer on the substrate commences.

18. The lithographic apparatus of claim 13, wherein the controller comprises:

a memory that stores transformation data corresponding to a difference between pattern data specified in the intended pattern data and the pattern to be set by the array of individually controllable elements for given processing conditions data.

19. The lithographic apparatus of claim 18, wherein the transformation data is updated based on a comparison of at least one feature intended to be generated on the substrate and an inspection of the corresponding at least one feature subsequently generated on the substrate.

20. The lithographic apparatus of claim 19, wherein the controller uses one or more modified versions of the transformation data for given processing conditions data at a plurality of locations on the substrate during the exposure of a pattern layer on the substrate.

21. The lithographic apparatus of claim 19, further comprising:
 a detector that inspects at least one pattern feature generated on the substrate,
 wherein the controller compares the at least one inspected pattern feature with the corresponding at least one intended pattern feature and updates the transformation data.

22. A lithographic method, comprising:
 controlling a pattern formed by an array of individually controllable elements using (1) intended pattern data, which corresponds to a pattern to be exposed on the substrate, and (2) processing conditions data, which corresponds to at least one processing condition of the substrate, wherein the processing conditions data determines which one of at least three intensity levels of the beam to use for at least one feature in the intended pattern data;
 patterning a beam of radiation using the formed patterned; and
 projecting the patterned beam onto a target portion of a substrate.

* * * * *